United States Patent [19]

Vinal

[11] Patent Number: 4,668,913

[45] Date of Patent: May 26, 1987

[54] CONSTANT FLUX MAGNETO RESISTIVE MAGNETIC RELUCTANCE SENSING APPARATUS

[75] Inventor: Albert W. Vinal, Cary, N.C.

[73] Assignee: International Business Machines Corporation, Armonk, N.Y.

[21] Appl. No.: 711,864

[22] Filed: Mar. 14, 1985

[51] Int. Cl.$^4$ .................. G06K 7/08; G01N 27/72; G01R 33/06; G01B 7/30

[52] U.S. Cl. .................. 324/235; 235/449; 324/208; 324/252; 360/113

[58] Field of Search .............. 324/207, 208, 228, 235, 324/251, 252, 243, 173, 174; 235/449, 450; 360/112, 113

[56] References Cited

U.S. PATENT DOCUMENTS

| | | |
|---|---|---|
| 3,337,795 | 8/1967 | Yamamoto et al. .............. 324/243 |
| 3,340,467 | 9/1967 | Ha .................................. 324/228 |
| 3,444,458 | 5/1969 | Scott ...................... 324/235 UX |
| 4,021,728 | 5/1977 | Makino et al. ............. 324/235 X |
| 4,122,505 | 10/1978 | Kuijk ............................. 324/252 X |
| 4,229,696 | 10/1980 | Gustafson ................... 324/228 X |
| 4,400,752 | 8/1983 | Chabrolle ................... 360/113 X |
| 4,566,050 | 1/1986 | Beam et al. ................. 324/252 X |

FOREIGN PATENT DOCUMENTS

| | | | |
|---|---|---|---|
| 2261498 | 6/1973 | European Pat. Off. . | |
| 2726370 | 12/1978 | European Pat. Off. . | |
| 0060157 | 5/1977 | Japan ........................... | 324/207 |
| 0447629 | 3/1968 | Switzerland ................. | 324/207 |

Primary Examiner—Gerard R. Strecker
Attorney, Agent, or Firm—Edward H. Duffield

[57] ABSTRACT

Disclosed is an improved method and apparatus for sensing magnetic reluctance variations. The invention may be used for magnetic ink character reading, such as is employed on bank checks, or for any of a variety of magnetic reluctance pickup applications. An improved magnetic reluctance sensor head utilizes an essentially U or C-shaped magnetically permeable member having a magnetizing coil encircling it. The coil is arranged to deliver essentially a constant magnetic flux to the U or C-shaped member. The tips of the U or C are placed adjacent to the element whose variation of reluctance is to be detected and a magneto resistive or other similar magnetic sensor is connected in the magnetic circuit either in parallel or in series with the variable reluctance which is to be sensed.

2 Claims, 5 Drawing Figures

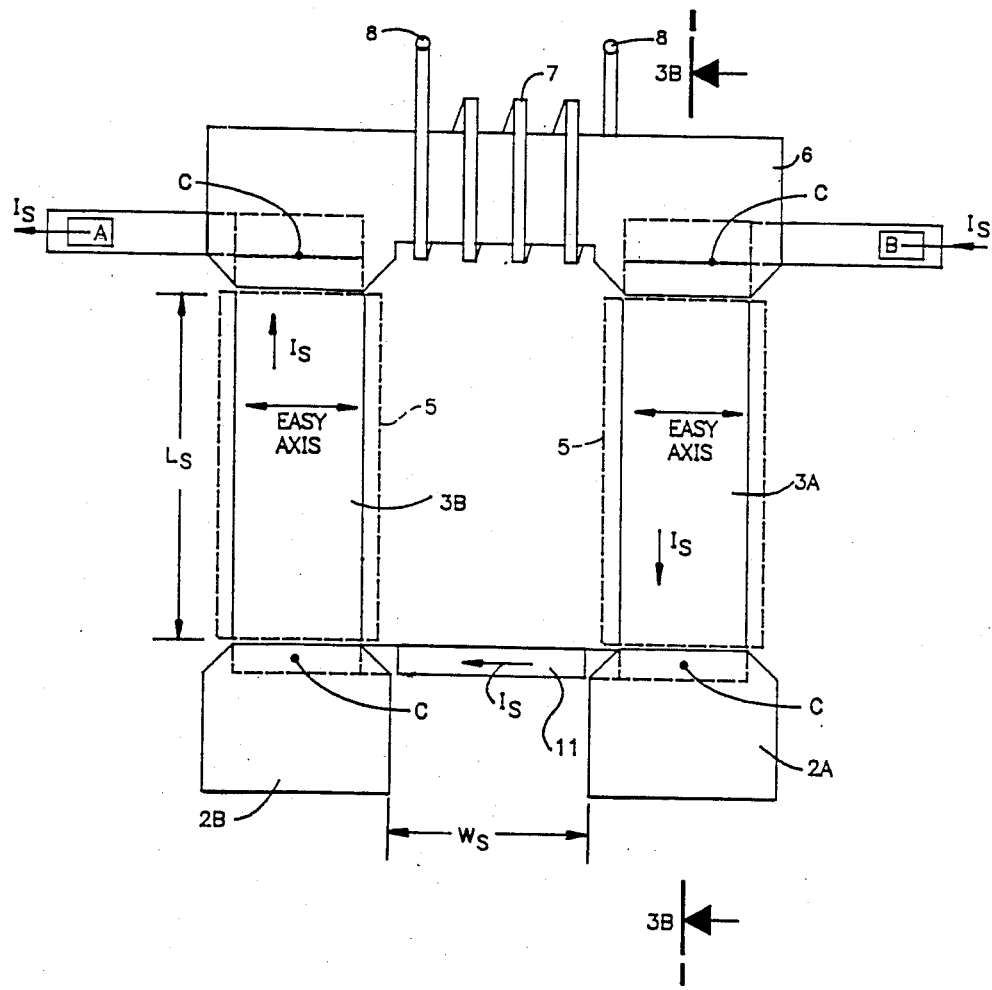

CONSTANT FLUX MAGNETO RESISTIVE MAGNETIC RELUCTANCE SENSING APPARATUS

FIELD OF THE INVENTION

This invention relates to magnetic reluctance sensing devices in general and to magnetic sensors employed in reluctance sensing arrangements in particular.

PRIOR ART

A variety of magnetic inductive sensors exist in the known art and are applied to the task of sensing magnetic ink characters on bank checks, to pulse generation or timing applications. Such applications as ignition rotor position inductive sensing in automotive ignition systems and gear tooth counting and machine control applications, are also common, to name but a few. Inductive sensors rely on the time rate of change of flux brought about by increasing or decreasing the number of lines of flux intersecting an electrically conductive coil. These sensors require magnetized media or machine elements to be effective. In contrast, reluctance sensors are capable of producing an output in the steady state, i.e., no relative motion between the sensor and the medium to be sensed, but rely upon precision measurements of variations in the drive coil current and/or voltage produced by changes in the magnetic reluctance path of a flux circuit. These arrangements are inherently difficult to maintain and operate due to wide variations produced by current and voltage fluctuations in power supplies, thermal effects and the like.

OBJECTS OF THE INVENTION

As a consequence of the foregoing known difficulties in the prior art, it is an object of this invention to provide an improved magnetic reluctance sensing method in which a separate magnetic flux sensor is inserted in the magnetic flux path to share at least a portion of the magnetic flux that will be supplied to the medium or element whose reluctance is to be sensed.

Yet another object of the invention is to provide an improved magnetic reluctance sensing apparatus in which an essentially constant magnetic flux is shared between the magnetic sensor and the object whose reluctance is to be sensed.

Yet another object of the invention is to provide an improved magnetic reluctance sense head structure in which an essentially constant magnetic flux is passed through magnetic sensors in series or in parallel and variations are measured in the flux conducted through them produced by the presence or absence of the medium whose reluctance is to be sensed when it is inserted in a flux path.

SUMMARY

The foregoing and still other unenumerated objects of the invention are met in the preferred embodiment by the provision of an essentially constant magnetic flux source applying a constant level of magnetic flux to a pair of sensing legs made of magnetically permeable material. The magnetically permeable legs may include magneto resistive magnetic sensing elements in series with them or may be bridged in parallel by a magneto resistive sensing element. The sensing element is either in a magnetic series or magnetically parallel circuit arrangement with the substance whose magnetic reluctance is to be sensed is placed in proximity to the tips or ends of the magnetically permeable conductive legs. A constant magnetic flux source is provided by a constant number of electrically conductive turns provided with a constant current in a coil surrounding a leg portion of the magnetically permeable structure.

BRIEF DESCRIPTION OF THE DRAWINGS

Preferred embodiments of the invention will be described in greater detail with reference to the drawings thereof in which:

FIG. 3A illustrates an alternative preferred embodiment in which magnetically sensitive elements are included in series with the magnetically permeable legs of the magnetic reluctance sensing head.

DETAILED SPECIFICATION

While the preferred embodiment of the present invention finds many applications in the field of magnetic detection and sensing, the most demanding applications presently are those involving sensing and detection of magnetic ink characters as applied to ordinary bank checks for automatic reading and sorting. While the invention will be described in greater detail with reference to such an application, it will be evident to those of skill in the art that magnetic reluctance sensing is by no means limited to the application of sensing magnetic ink characters but may be extended to general magnetic sensing for pulse counting, timing and proximity measurements to name but a few.

It is well known that magnetic ink characters applied to bank checks for automatic reading exhibit a very poor magnetic remanence. When such characters are magnetized, the vertical field component available for sensing from the typical carbonyl iron ink material is in the order of only a few Oersteds. The normal detection mechanism for such magnetic ink characters utilizes magnetic inductive sensors. For such sensors, due to the flux derivative sensing technique employed, high velocity transports and elaborate frequency filtering mechanisms are required to obtain even a minimum signal to noise ratio. In comparison, however, the magnetic ink character materials do exhibit a relatively low magnetic reluctance path as opposed to air when subjected to a magnetic field. The average permeability for carbonyl iron is stated in the literature to be approximately 55 in the presence of a field of 20 Gauss. Reluctance sensing is by far the preferred approach for detecting the presence of magnetic ink characters in view of this fact.

The preferred embodiments of the invention disclosed herein utilize a reluctance sensing scheme employing a new coupled film magneto resistive sensor element in configuration with other elements in the preferred embodiment for measuring the effects of a differential reluctance created by the presence or absence of magnetic ink characters. The sensor itself will be described only briefly since other forms of magnetically sensitive elements might be used; namely, magnetically sensitive transistors, diodes, Hall cells, and the like, to name but a few. My commonly assigned copending application Ser. No. 584,364 now U.S. Pat. No. 4,626,946 describes the structural details of a suitable magneto resistive sensor as will be described briefly herein.

The sensing technique employed in the present invention does not resort to the use of alternating magnetic fields for detecting the presence of magnetic ink characters, nor has it been found necessary to precondition the ink characters before attempting to sense their presence. Machine or hand scanning of bank checks utilizing this new technology produces the same results because the detection system is velocity insensitive. Even DC or steady state reluctance measurements are usually achieved.

Figure 1A:
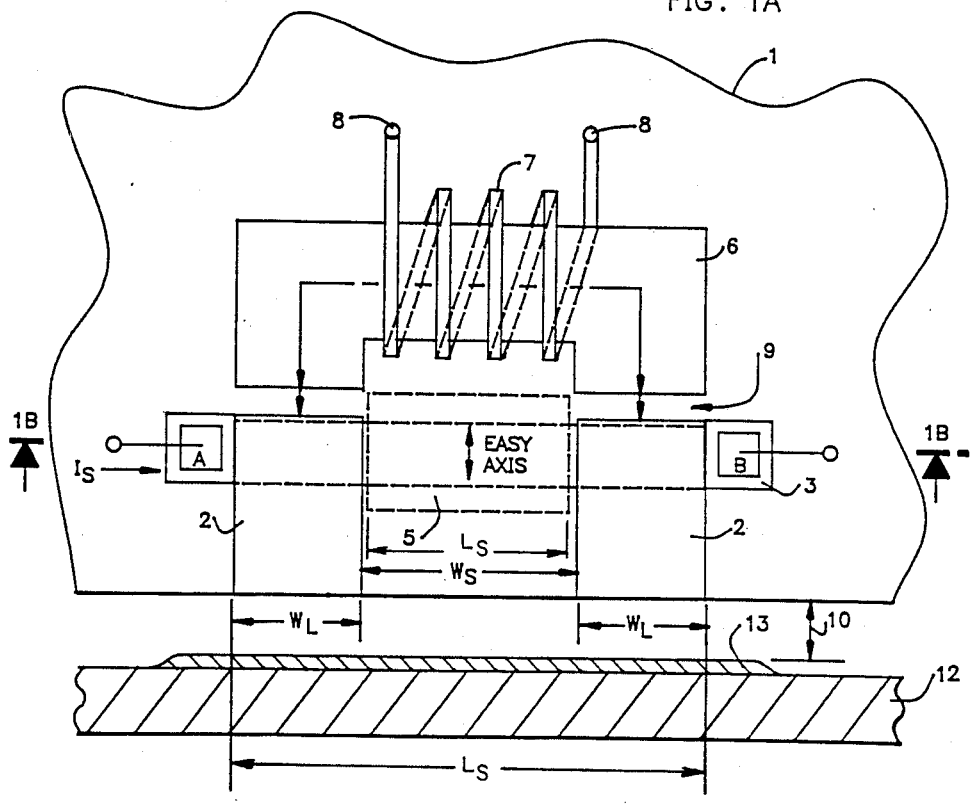
FIG. 1A is a schematic elevational view of a magnetic reluctance sense head structure in position adjacent to a magnetic ink character.

Turning to FIG. 1A, an overall pictorial schematic of a preferred embodiment of the present magnetic reluctance sensing head is shown in proximity to a cross section of an exemplary piece of paper having deposited on its surface a thickness of magnetically permeable ink.

Figure 1B:
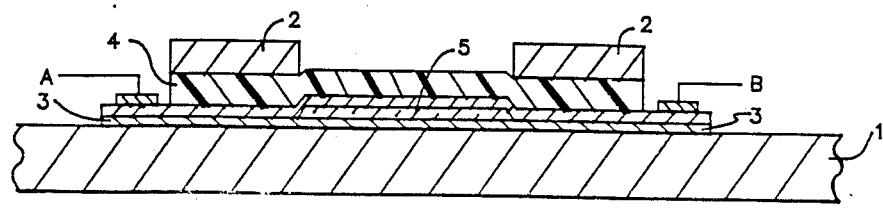
FIG. 1B is a cross-sectional elevation of the magnetic reluctance sense head illustrating its layered structure as deposited on a semiconductive substrate.

The embodiment depicted in FIG. 1A is constructed using photo lithographic deposition and etching techniques familiar to those of skill in the large scale integrated circuit arts. This technique is used to facilitate making the magnetic reluctance sensors of small size so that numerous sensors may be ganged together in parallel for sensing a whole array of characters. Consequently, the sensor is depicted as being deposited on the top surface of a semiconductive substrate 1. Two-ended vertical coupling legs of the U or C-shaped member are shown as legs 2. These could be formed of nickel iron alloy typically of 1 micron (micro meter) thick or less and approximately 4 mils wide as shown by the dimension $W_L$ in FIG. 1A. The two coupling legs 2 each have first and second ends, that may be termed "proximate" and "distal" ends, respectively. The legs 2 are spaced apart by a distance $W_S$ of approximately equal width to the legs 2. A magneto resistive sensor consisting of a pair of approximately 300 Angstrom thick nickel iron films with an intermediate 250 Angstrom thick titanium isolation layer 5 is shown as sensor 3. Sensor 3 is magnetically linked to the proximate ends of the magnetically permeable legs 2 but is electrically isolated therefrom by a 5000 Angstrom thick silicon dioxide layer for example. This is shown as an underlying oxide layer 4 which is not apparent in FIG. 1A but which separates the proximate ends of the magnetically permeable legs 2 from actual electrical and physical contact with the coupled film magnetic sensor 3 as shown in FIG. 1B, the cross-sectional elevation of FIG. 1A.

A gap 9 separates the magnetic flux core member 6 from the proximate ends of the magnetically permeable legs 2. The purpose of the gap 9 is to make the reluctance path from the medium 13 at the distal ends of the permeable legs 2 through the core 6 of much higher reluctance than the path from the distal ends of the legs 2 through the sensor 3. The gap 9 also provides a means of delivering an essentially constant magnetic flux to be shared by the MR sensor 3 and material 13 whose reluctance is to be sensed when it is positioned adjacent the distal ends of tips of the legs 2 where material 13 acts essentially as a keeper path. Typically, magnetic ink 13 is deposited on a substrate of paper 12 which could be separated from the tips of legs 2 by a distance 10 on the order of a fraction to one or two microns. The magnetic ink layer 13 acts essentially as a magnetic keeper for the magnetic flux emanating from the distal ends of the permeable legs 2.

The core member 6 is made of nickel iron alloy as are the permeable legs 2, and has deposited around it a conductive coil 7 consisting of N turns of conductive lines such as aluminum. Appropriate oxide insulation would be formed over the top surface and bottom surface of the magnetically permeable core 6 in a manner well known in the art. Briefly, an oxide layer would be deposited on the substrate 1 and the first half of the conductors 7 as shown in dotted lines in FIG. 1A would be laid down. These will be overlain with another insulation layer on which would be deposited the core material for core 6. Another layer of insulation would follow with etching through at the points where the conductors are to be joined. Then the top layer of the conductors 7 would be deposited on top of the insulator and through the etched holes to make contact with the lower portions of the conductors 7. Contacts 8 would then be supplied to provide current I. The result is an electro-magnetic core 6 having NI amp turn MMF flux generating power.

Typical dimensions for the sensor 3 would be 5 microns width and 12 to 15 microns length as shown in FIG. 1A.

FIG. 1B illustrates a cross-sectional elevation view looking from the tips or distal ends of the legs 2 as shown by the sectional lines in FIG. 1A. It may be observed that electrical contacts A and B are made to the MR sensor 3 which consists of two layers of nickel iron film separated by an intermediate separator 5 in the zone where magnetic sensitivity is desired. As shown in FIG. 1B, the zone of sensitivity of the MR sensor 3 is in the gap region between the two legs 2. The MR films 3 are joined electrically and mechanically in the region where they underlie the proximate ends of magnetically permeable legs 2. The contacts A and B are utilized to supply a sensing current $I_S$ on the order or 3 milliamps in the preferred embodiment.

Returning to FIG. 1A, it may be seen in the depicted example that when a 3 milliamp sense current is applied to contacts A and B of the MR sensor 3, and assuming a constant flux in the core member 6 due to a constant current I in the winding 7, that the MR sensor 3 essentially shunts or bridges the proximate ends of the magnetically permeable legs 2 to conduct part of the flux from core 6 while the distal ends of said legs 2 are in adjacency to a magnetically permeable shunting material such as the magnetic ink layer 13 deposited on a paper substrate 12. The magnetically permeable material 13 conducts another portion of the magnetic flux from the core 6. Depending upon the magnetic reluctance of the substance 13, the reluctance path through the substance 13 will be greater or less than that through the MR sensor 3. Accordingly, sensor 3 will conduct more or less, respectively, of the flux coming from core 6. The resultant variation in conductivity of the MR sensor 3 can be observed through the contacts A and B to provide a direct indication of magnetic reluctance observed at the conductive leg 2 to medium 13 interface. Obviously, a wide variety of other sensor technologies might be employed including magnetic transistors, Hall cells and the like. However, the magneto resistive sensor technology as depicted herein is superior in that it is most easily compatible with the construction techniques employed for creating the rest of the magnetic structure.

As can be seen from FIGS. 1A and 1B, the basic design of the reluctance measuring head is simple and it consists almost entirely of deposited magnetic film and insulation layers of a simple outline that may be easily masked and laid down. Typical dimensions for the structural components have been described above. The sensor is located at a relatively remote position from its interface with the paper bearing a magnetic ink character so that wear and fabrication and thermal effect problems are minimized.

Figure 2:
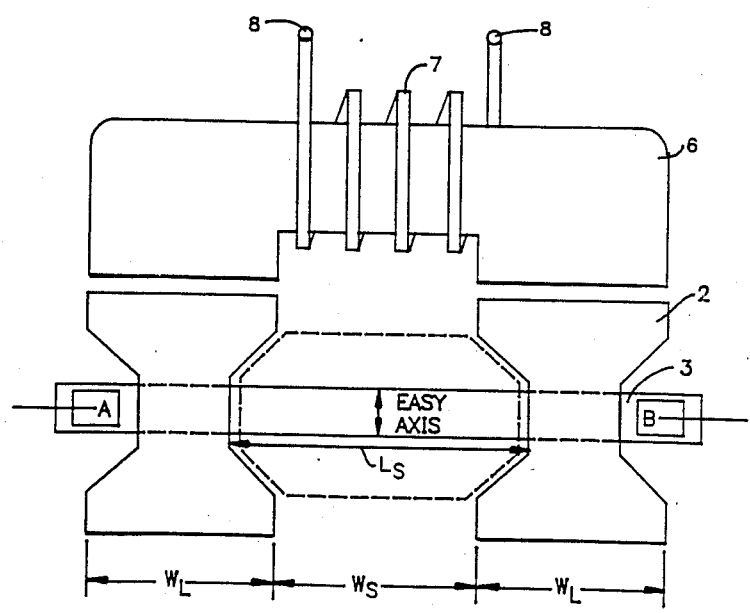
FIG. 2 illustrates a schematic elevation of a modified form of the preferred embodiment in FIGS. 1A and 1B.

The MR sensor 3 consists of two parallel nickel iron film layers each having an easy axis of magnetization arranged perpendicular to the length $L_S$ of the overall sensor leg 3 bridging the proximate ends of the vertical coupling legs 2. The two layers of the MR sensor 3 are magneto statically coupled along the direction of the easy axis as shown in FIGS. 1A and 2. A low conductivity metal film isolation layer, on the order of 200 to 350 Angstroms thick, is chosen to be titanium in FIGS. 1A and 1B. This is shown as the layer 5. The low conductivity metal does not seriously detract from the sensor current $I_S$ and prevents magnetic exchange coupling mechanisms from occurring between the two films that form the sensor 3. When current of a density J is passed through both of the layers of the MR sensor 3, the current produces a mutual magnetizing field in the sensor films that forces an anti-parallel easy access magnetic couple to exist. This mutual magnetizing field is oriented along the easy magnetic axis as depicted in FIGS. 1A and 2. The field intensity experienced in one of the film layers due to a current $I_S$ flowing in the other layer is opposite in direction to the magnetizing field experienced in the other layer due to current flowing in the first layer and vice versa. The current $I_S$ produces a voltage drop across the magneto resistive element 3 which is modified by changes in resistance influenced by the change in the proportion of flux conducted by the sensor which are brought about by changes in reluctance via coupling to the medium 13 occurring at the distal ends of the vertical coupling legs 2. The variation in circuit reluctance at the distal ends of the coupling legs 2 results in a proportional change in the magnetic flux passing through sensor 3 and in the overall magnetization vector at rest in the MR films 3 which modifies the overall electrical resistivity of each MR film layer in a manner well known in the art.

In the cross section of the sensor 3 shown in FIG. 1B, the sensitive portion of sensor 3 lies between the vertical legs 2. The coupled film sensor 3 is insulated from the legs 2 by the silicon dioxide insulation layer 4. The thickness of each of the magneto resistive layers 3 is required to be identical and is typically 300 Angstroms. The height and width of each film layer should also be equal since these dimensions also control the overall reluctance of the sensor itself. As is well known in the art, MR sensors of the type described are deposited in the presence of an intense magnetic field oriented to produce an easy magnetic axis in the chosen direction. In the case at hand, the easy magnetic axis is chosen to be perpendicular to the length $L_S$ of the overall sensor 3.

The current I supplied to the magnetizing coil 7 creates a magnetic flux that couples through the air gap 9 to the proximate ends of the vertical coupling legs 2 and through the MR sensor leg 3 where it torques the magnetization within the MR films toward the hard axis (horizontal in FIGS. 1A and 2). The MR sensor 3 becomes saturated when magnetization within the films is forced to lie parallel with the hard magnetic axis. The electrical current passing down the MR sensor films shown as $I_S$ tends to torque the magnetization within the sensor films back toward the easy axis. In operation then, current is passed through the magnetizing coil 7 such that magnetization within both film layers 3 is caused to uniformly rotate toward the hard magnetic axis. The electrical current $I_S$ conducted by each layer of the sensor 3 prevents the magnetization vector from fully reaching the hard axis. The device will have greatest sensitivity when the magnetization vector is close to the hard axis and the least sensitivity when the magnetization vector is closer to the easy axis.

When the distal end portions of the coupling legs 2 are brought into close proximity to a magnetic ink bearing medium, part of the flux generated by the coil current I flowing through coil 7 passes through the magnetic ink 13, shunting the magneto resistive sensor leg 3 and reducing the flux passing through the coupled MR film sensor leg 3. When this occurs, magnetization within both anti-parallel MR films rotates back toward the easy magnetic axis. This results in a change in the electrical resistance between terminals A and B easily observed in the variation of voltage required to maintain a constant current $I_S$.

FIG. 2 illustrates a slightly modified version of the structure shown in FIG. 1A. The modified structure minimizes the ambiguous state of magnetization within the MR leg 3 in the area located under the vertical leg members 2. Field coupling from the legs 2 to the MR sensor 3 is improved by flux concentration effects produced by necking down or tapering the coupling legs 2 where they cross over the sensor 3. Also the effective length of the MR sensor is increased leading to at least a 20% increase in signal amplitude, because the reduced width of legs 2 leaves more active area for the sensor 3 along the sensor length $L_S$.

Returning to FIG. 1A, the sensor head-to-check height is depicted as a dimension 10. With the head-to-check height varied from 0 to a 1 mil space, the signal response is calculated to be 600 micro volts when the legs 2 are in contact with magnetic ink layer 13, 370 micro volts when a quarter mil space for dimension 10 exists, and 240 micro volts when a 1 mil space is present. This assumes a current density J of $1 \times 10^6$ amps per square centimeter flowing through the sensor 3. A magnetizing coil current of approximately 40 milliamps and a 5 turn coil as depicted in the figures is assumed. The magnetic ink permeability is assumed to be 55 at 20 Gauss and the MR sensor resistance is approximately 27 Ohms. A 3 milliamp sensor current is included. The power dissipated by the sensor is thus approximately 243 micro watts. Shot noise will be on the order of 0.26 micro volts with a 100,000 cycle bandwidth.

Figure 3B:
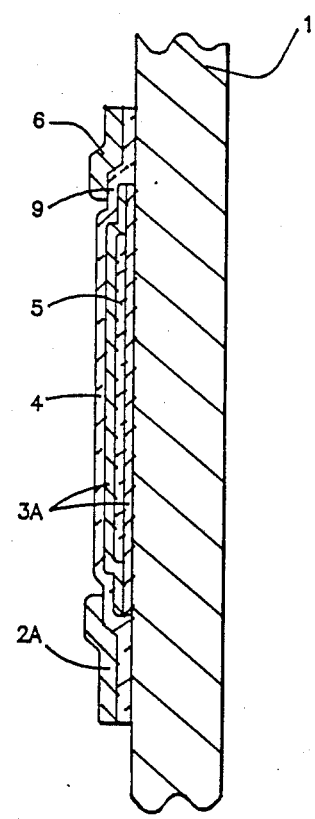
FIG. 3B is a longitudinal cross section elevation of the structure depicted in FIG. 3A.

An improved form of the sensor is depicted in FIG. 3A. The sensor 3 from FIG. 1A is replaced by two sensors, 3A and 3B, in this FIG. 3A. Also, the sensors are now in series with the magnetically conductive legs 2A and 2B instead of shunting or bridging the legs 2 as shown in FIG. 1A. The structure in FIGS. 3A and 3B illustrates an alternative embodiment that has a much higher sensitivity than the structure shown in FIGS. 1A and 1B and 2. This head structure is capable of adequately sensing thin magnetic ink with a permeability as low as 4 instead of the assumed 55 and at an altitude of 2 mils above the check surface instead of the normal altitude of a quarter to a half a mil assumed for the earlier embodiment.

In FIG. 3A, the basic design of this embodiment is similar to that in FIG. 1 in that most of the elements are constructed utilizing film masking and deposition steps familiar to those of skill in the LSI and circuit arts. Similar elements are similarly numbered in FIGS. 1A, 1B, 2 and 3A so that independent discussion of each of them such as the core 6 is unnecessary unless differences in structure or operation exist. The differences will be addressed herein.

The basic structure depicted in FIG. 3A has an inverted U-shape. Coupled film magneto resistive elements 3A and 3B form part of each vertical coupling leg 2 in this structure. Magnetizing coil 7 similar to that in the other figures encircles the top cross member and energizes the MR sensors 3A and 3B and applies a flux to the gap at the ends of the coupling legs 2A and 2B. It is evident from FIG. 3A that the width of the MR sensor legs 3A and 3B is less than the width of the 1 micron thick nickel iron coupling legs 2A and 2B. It may be shown that the width of the MR sensors 3A and 3B dramatically influences the magnitude of the current required by the magnetizing coil 7 but has nothing whatever to do with the overall signal amplitude. The sensors 3A and 3B in each leg 2 of the structure consist of a pair of parallel uniaxial magnetic films of the same form, structure and overall dimension as those depicted and described with reference to FIG. 1A and 1B. Electrically, the two MR sensors 3A and 3B are connected in series with connector 11 and the current $I_S$ is passed between the contacts A and B as previously described. The voltage developed between terminals A and B due to the resistance changes is that required to maintain the constant current $I_S$. The variation in voltage is a measure of the differential flux passing through the MR legs 3A and 3B and ultimately is a measure of the reluctance of the material that may be introduced in the sensor gap at the ends of the legs 2A and 2B.

The operation of the reluctance sensing device depends upon the fundamental principle that the product of flux flowing around a closed loop and the reluctance R of the loop is proportional to the number of current turns encircling the loop. Referring to the structure in FIG. 3A, when part of the reluctance path between the distal ends of legs 2A and 2B of the inverted U-shaped structure is bridged by magnetic ink, the closed loop reluctance drops compared to having air in the gap. In order to satisfy the foregoing basic principle, the magnetic flux flowing in the closed loop must increase for a given current since the product of current times turns is constant. Consequently, magnetization within the MR legs 3A and 3B rotates from a stable rest angle to a new rest angle relative to the hard axis. This results in a change in resistance in the MR legs 3A and 3B and an observable change in the voltage developed across terminals A and B.

The sensor current $I_S$ is conducted by a non-magnetic conductive leg 11 bridging the gap between the distal ends of legs 2A and 2B and electrically insulated from them by the oxide layer 4 seen to better advantage in the cross section in FIG. 3B. The titanium layer 5 separates the two films of a sensor 3A as shown in this figure. At points C in each leg 2, however, the titanium layer is omitted and the MR films come in direct physical and electrical contact with one another. One of these joints C in one of the legs 2A is connected via the conductor 11 shown in FIG. 3A to its counterpart in the sensor occupying the other leg 2B of the structure shown in FIG. 3A. Because the electrically conductive member 11 is not magnetically conductive, it does not shunt any of the magnetic flux from core member 6 nor does it interact with the magnetic operation in any way.

Assuming five coil turns with 110 milliamp coil current and a sensor current of 15 milliamps, a sensor resistance of 8 Ohms and ink permeability of 55 at 20 Gauss, a sensor width of 1 mil and a sensor length of 6 mils for the device shown in FIG. 3A, the following are the signal responses calculated for the head-to-check height 10. With 0 space, i.e., head-to-check contact, a 3.94 millivolt signal should be expected. At a one quarter mil space, 2.68 millivolt signals are expected. At a ½ mil space, 2 millivolts of signal and at a 1 mil space, 1.2 millivolts of signal and at a 2 mil space, 725 micro volt signals are expected. Contrasted to the head structure depicted in FIGS. 1A and 1B, it may be seen that a greater than one order of magnitude increase in signal response is possible with this altered structure as shown in FIGS. 3A and 3B.

As will be evident to those of skill in the art, the preferred embodiments of magnetic reluctance sensing apparatus and the method of employing magnetic sensors either in shunt or in series with the material whose reluctance is to be sensed are generally applicable to a variety of reluctance sensing tasks. The nature of the task may dictate the form of the structure of the coupling members, the orientation of the sensor and the magnitudes of the various currents and voltages experienced, but will not alter the overall mode of operation and basic structure of the sensors and reluctance detecting elements. Therefore, numerous modifications in form and structure can easily be made to suit a given application without departing from the scope and spirit of the invention. Wherefor, what is described in the following claims and for which protection of Letters Patent is desired in intended by way of description and not as limitation.

I claim:

1. Magnetic reluctance sensing apparatus, comprising:

a source of constant magnetic flux;

two magnetically permeable coupling members having proximate and distal ends;

a magnetically permeable flux sensor means; and said magnetically permeable coupling members each being supplied at their proximate ends with constant magnetic flux by coupling each through first reluctance gaps of equal reluctance to said magnetic flux source, said magnetically permeable coupling members supplying a portion of said magnetic flux through second equal reluctance gaps at said proximate ends thereof to said magnetically permeable sensor; and said magnetically permeable coupling members supplying the remainder of said magnetic flux to third equal reluctance gaps located between said distal ends of said magnetically permeable coupling members and coupling said flux to a material whose reluctance is to be sensed wherein, said first, second and third reluctance gaps are constructed so that the total reluctance in the flux path from said distal ends of said coupling members through said sensor is less than the total reluctance in the path from said distal ends of said coupling members through said constant magnetic flux source whereby reluctance variations in the material whose reluctance is to be sensed will result in flux variations coupled through said permeable sensor in an inverse relation to the amount of flux coupled to said material.

2. A magnetic reluctance sensing apparatus, comprising:
- a source of constant magnetic flux;
- a pair of magnetically permeable coupling legs having distal and proximate ends said coupling legs receiving magnetic flux from said source of magnetic flux and transmitting said flux to a medium whose reluctance is to be sensed;
- a magnetic flux sensing means is magnetically permeable material;
- said source of magnetic flux being arranged to supply said constant magnetic flux through first equal reluctance gaps to said sensing means; and
- said sensing means transmitting said flux to said proximate ends of said coupling legs through second equal reluctance gaps and;
- said distal ends of said coupling legs confronting a medium whose reluctance is to be sensed and forming third equal reluctance gaps therewith whose reluctance varies in direct proportion to the permeability of said medium whose reluctance is to be sensed and; said reluctance variation resulting in a directly proportional variation in flux coupled through said permeable flux sensing means; and
- said first, second and third reluctance gaps being constructed so that the total reluctance in the flux path from said distal ends of said coupling members through said sensors is less than the total reluctance in the path from said distal ends of said coupling members through said constant magnetic flux source.

* * * * *